United States Patent
Friend et al.

(10) Patent No.: US 11,903,152 B2
(45) Date of Patent: Feb. 13, 2024

(54) WALL MOUNTED THERMOSTAT ASSEMBLY

(71) Applicant: Johnson Controls Technology Company, Auburn Hills, MI (US)

(72) Inventors: Richard David Friend, Levittown, PA (US); Justin C. Pasquale, West Chester, PA (US)

(73) Assignee: Johnson Controls Tyco IP Holdings LLP, Milwaukee, WI (US)

( * ) Notice: Subject to any disclaimer, the term of this patent is extended or adjusted under 35 U.S.C. 154(b) by 409 days.

(21) Appl. No.: 17/144,072

(22) Filed: Jan. 7, 2021

(65) Prior Publication Data
US 2021/0207841 A1      Jul. 8, 2021

Related U.S. Application Data

(60) Provisional application No. 62/958,600, filed on Jan. 8, 2020.

(51) Int. Cl.
*H05K 5/02*      (2006.01)
*F24F 110/10*    (2018.01)
(Continued)

(52) U.S. Cl.
CPC ............ *H05K 5/0204* (2013.01); *F24F 11/46* (2018.01); *F24F 11/52* (2018.01); *F24F 11/56* (2018.01); *F24F 11/64* (2018.01); *F24F 11/65* (2018.01); *F24F 2110/10* (2018.01); *F24F 2140/50* (2018.01); *F24F 2140/60* (2018.01); *G05B 19/042* (2013.01); *G05B 19/0426* (2013.01);
(Continued)

(58) Field of Classification Search
CPC ........ H02G 3/14; H02G 3/123; H05K 5/0017; H05K 5/0204; H05K 5/0073
See application file for complete search history.

(56) References Cited

U.S. PATENT DOCUMENTS 2,888,537 A * 5/1959 Mears ................ H01H 37/04
                                                337/338
8,420,956 B2 * 4/2013 Alderson ............ H02G 3/12
                                                174/67

(Continued)

OTHER PUBLICATIONS

Centrica Connected Home Limited, "Hive Active Heating—Thermostat User Guide," England, 2017, 24 pages.

*Primary Examiner* — James Wu
(74) *Attorney, Agent, or Firm* — Foley & Lardner LLP

(57) ABSTRACT

A trim plate for a wall mounting assembly is shown. The trim plate includes a body defined by a first end and a second end opposite the first end, the first end defining a front section and the second end defining a rear section, the body defining a passageway extending from the rear section, through the body, to the front section. The body includes a plurality of mounting holes formed through the body and spaced apart from one another around the passageway. The body further includes a positioning feature formed outward from the passageway and spaced apart from the mounting holes. The positioning feature is defined by rearwardly extending walls partially surrounding an aperture formed through the front section of the body, the rearwardly extending walls defining a pocket formed therebetween, the pocket extending along the rear section beyond the aperture.

14 Claims, 16 Drawing Sheets

(51) Int. Cl.
*F24F 11/52* (2018.01)
*F24F 140/60* (2018.01)
*F24F 140/50* (2018.01)
*F24F 11/64* (2018.01)
*F24F 11/46* (2018.01)
*F24F 11/65* (2018.01)
*F24F 11/56* (2018.01)
*G05B 19/042* (2006.01)

(52) U.S. Cl.
CPC .............. *G05B 2219/23258* (2013.01); *G05B 2219/2614* (2013.01)

(56) References Cited

U.S. PATENT DOCUMENTS

| | | | | |
|---|---|---|---|---|
| 8,802,981 | B2 * | 8/2014 | Wallaert | F24F 11/00 337/380 |
| 9,941,183 | B2 * | 4/2018 | Read | F16M 13/02 |
| 10,024,568 | B1 * | 7/2018 | Read | F24F 11/30 |
| 10,648,615 | B1 * | 5/2020 | Conklin | F16M 13/027 |
| 2005/0165601 | A1 | 7/2005 | Gupta et al. | |
| 2007/0158442 | A1 | 7/2007 | Chapman et al. | |
| 2009/0271365 | A1 | 10/2009 | Chen et al. | |
| 2010/0064061 | A1 | 3/2010 | Warren et al. | |
| 2010/0289643 | A1 | 11/2010 | Trundle et al. | |
| 2011/0069010 | A1 | 3/2011 | Yi et al. | |
| 2011/0184574 | A1 | 7/2011 | Le Roux et al. | |
| 2012/0232969 | A1 | 9/2012 | Fadell et al. | |
| 2014/0145978 | A1 | 5/2014 | Hsu | |
| 2015/0095820 | A1 | 4/2015 | Fellman | |
| 2015/0339917 | A1 | 11/2015 | Messing et al. | |
| 2016/0048215 | A1 | 2/2016 | Shin et al. | |
| 2016/0055105 | A1 | 2/2016 | Hsieh et al. | |
| 2017/0082313 | A1 | 3/2017 | Benichou et al. | |
| 2017/0328591 | A1 | 11/2017 | Kelly et al. | |
| 2018/0136676 | A1 | 5/2018 | Sloo et al. | |
| 2018/0260188 | A1 | 9/2018 | Rossbacher | |
| 2018/0283723 | A1 | 10/2018 | Ock et al. | |
| 2019/0364173 | A1 | 11/2019 | Fleizach et al. | |
| 2020/0233500 | A1 | 7/2020 | Mannby | |

* cited by examiner

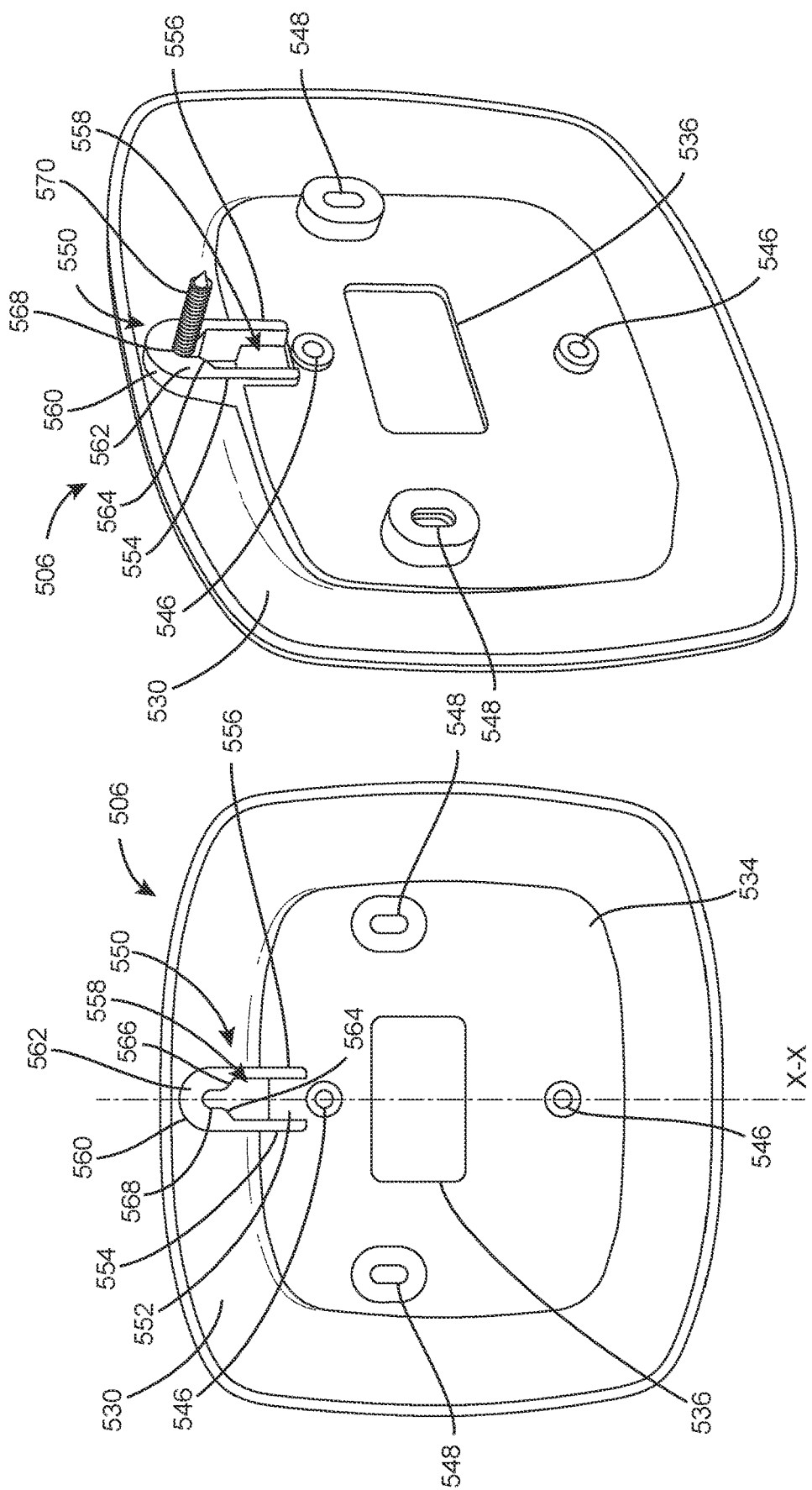

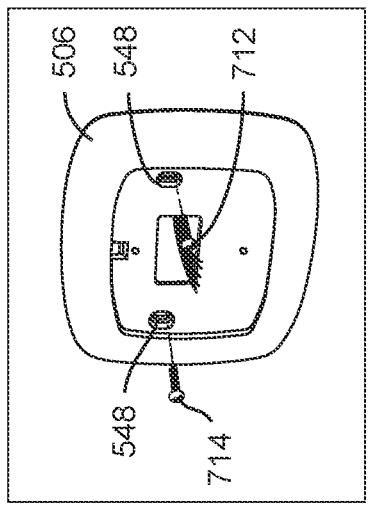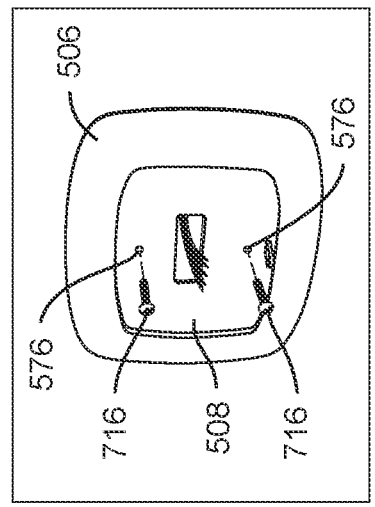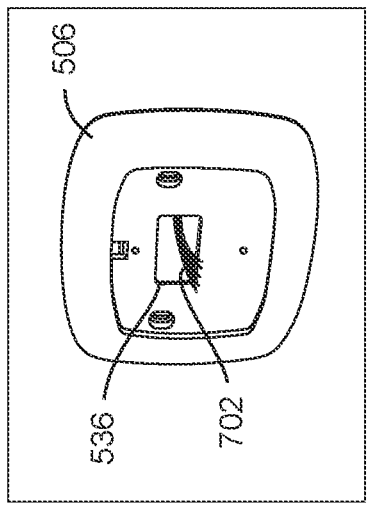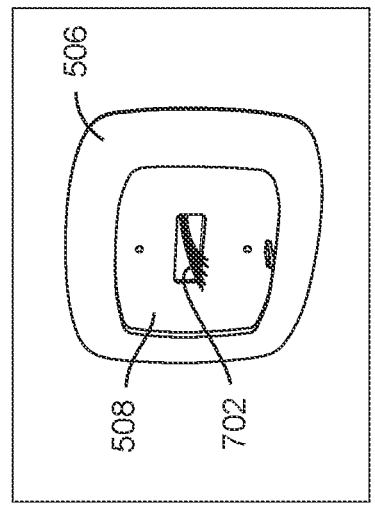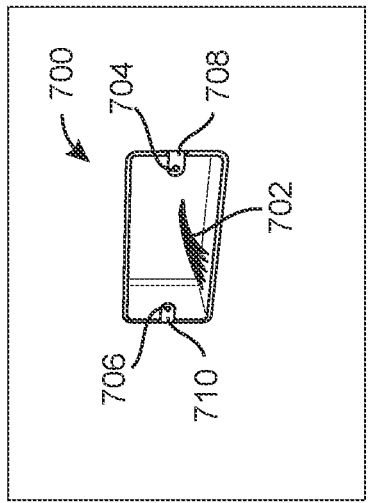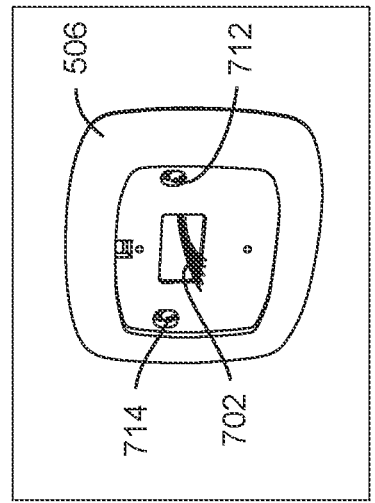
FIG. 24
FIG. 25
FIG. 26
FIG. 27
FIG. 28
FIG. 29

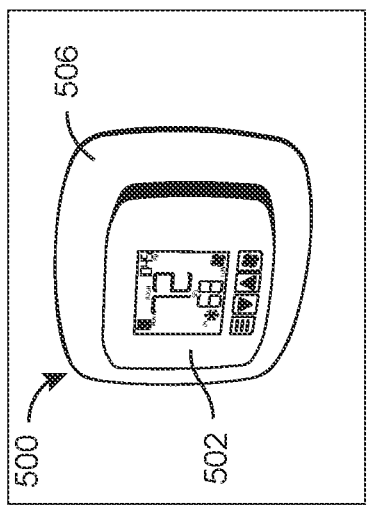
FIG. 31
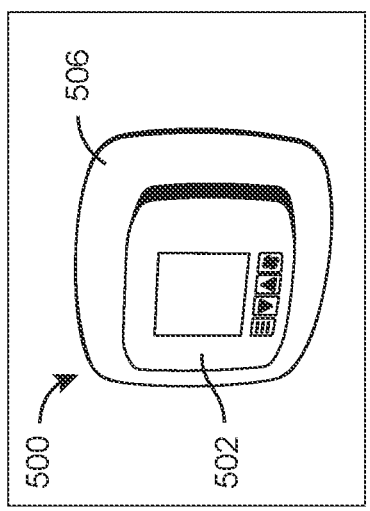
FIG. 32
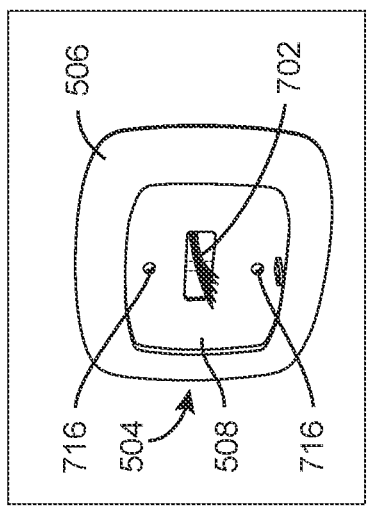
FIG. 30
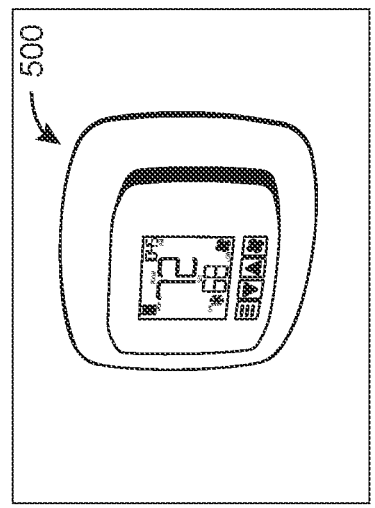
FIG. 34
FIG. 33

WALL MOUNTED THERMOSTAT ASSEMBLY

CROSS REFERENCE TO RELATED APPLICATION

The present application claims the benefit of and priority to U.S. Provisional Application No. 62/958,600, filed Jan. 8, 2020, which is incorporated by reference herein in its entirety for all purposes.

BACKGROUND

The present disclosure relates generally to building systems that control environmental conditions of a building. The present disclosure relates more particularly to thermostats of a building system.

Systems of a building may include various controllers configured to generate control decisions for heating or cooling equipment or systems. The controllers can, in some cases, be thermostats. Thermostats can be utilized in both residential and commercial building systems. Thermostats can receive, or themselves measure, environmental conditions such as temperature and generate control decisions based on setpoints and/or the measured temperature for operating the heating or cooling equipment or systems. Thermostats include physical displays for presenting measured or control information to a user and for receiving input from the user, e.g., a user desired setpoint or operating schedule.

SUMMARY

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

One implementation of the present disclosure is a trim plate for a wall mounting assembly. The trim plate includes a body defined by a first end and a second end opposite the first end, the first end defining a front section and the second end defining a rear section, the body defining a passageway extending from the rear section, through the body, to the front section. The body includes a plurality of mounting holes formed through the body and spaced apart from one another around the passageway. The body further includes a positioning feature formed outward from the passageway and spaced apart from the mounting holes. The positioning feature is defined by rearwardly extending walls partially surrounding an aperture formed through the front section of the body, the rearwardly extending walls defining a pocket formed therebetween, the pocket extending along the rear section beyond the aperture.

In some embodiments, the aperture is positioned along a centerline of the passageway.

In some embodiments, the pocket is further defined by a rounded stop extending between ends of the rearwardly extending walls.

In some embodiments, the pocket is further defined by a cover extending at least partially across the pocket from each of the rearwardly extending walls, the cover defining tapered surfaces formed inwardly from the rearwardly extending walls and a terminal portion defined by a width smaller than a width of the aperture.

In some embodiments, the pocket is defined by a continuous structure extending from a first side of the aperture, upwardly toward an outer perimeter of the body, to a rounded stop, and downwardly toward a second side of the aperture opposite the first side.

In some embodiments, the plurality of mounting holes include at least two different sizes of holes.

In some embodiments, the body is defined by a raised perimeter section surrounding a recessed section, and wherein the plurality of mounting holes and the passageway are each formed through the recessed section.

Another implementation of the present disclosure is a wall mounting assembly for a thermostat. The wall mounting assembly includes a trim plate having a body defined by a first end and a second end opposite the first end, the first end defining a front section and the second end defining a rear section, the body defining a first passageway extending from the rear section, through the body, to the front section. The body further includes a plurality of mounting holes formed through the body and spaced apart from one another around the first passageway and a positioning feature formed outward from the first passageway and spaced apart from the mounting holes, the positioning feature defined by rearwardly extending walls partially surrounding an aperture formed through the front section of the body, the rearwardly extending walls defining a pocket formed therebetween, the pocket extending along the rear section beyond the aperture. The body further includes a back housing received within the body of the trim plate, the back housing defining a second passageway therethough aligned along a centerline of the first passageway, the second passageway being smaller than the first passageway.

In some embodiments, the back housing is defined by a body having a rectangular shape and further including a mounting tab extending outwardly away from the body, the mounting tab including a hole formed therethrough.

In some embodiments, at least two holes formed through the back housing are aligned coaxially with at least two mounting holes within the plurality of mounting holes.

In some embodiments, the aperture is positioned along a centerline of the passageway.

In some embodiments, the pocket is further defined by a rounded stop extending between ends of the rearwardly extending walls.

In some embodiments, the pocket is further defined by a cover extending at least partially across the pocket from each of the rearwardly extending walls, the cover defining tapered surfaces formed inwardly from the rearwardly extending walls and a terminal portion defined by a width smaller than a width of the aperture.

In some embodiments, the pocket is defined by a continuous structure extending from a first side of the aperture, upwardly toward an outer perimeter of the body, to a rounded stop, and downwardly toward a second side of the aperture opposite the first side.

In some embodiments, the plurality of mounting holes include at least two different sizes of holes.

In some embodiments, the body is defined by a raised perimeter section surrounding a recessed section, and wherein the plurality of mounting holes and the first passageway are each formed through the recessed section, and wherein the back housing is received within the recessed section.

Another implementation of the present disclosure is a method of installing a thermostat to a junction box. The method includes inserting a fastener into a mounting tab of a junction box so that a head of the fastener does not engage the mounting tab. The method further includes positioning a trim plate on the fastener by urging the trim plate forward, so that a head of the fastener enters within a pocket formed within a body of the trim plate. The method further includes lowering the trim plate relative to the junction box to direct the fastener upward into the pocket, the pocket having a variable width that funnels the fastener toward a centerline of the trim plate as the trim plate is lowered.

In some embodiments, the method further includes passing wires through a passageway formed through the trim plate.

In some embodiments, the method further includes inserting a back housing into a recessed section of the trim plate.

In some embodiments, the method further includes inserting a back housing into a recessed section of the trim plate, wiring a thermostat to wires extending outwardly from the junction box, and securing the thermostat to the back housing by threading a screw vertically through a hole formed in a bottom side of the thermostat.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 9 is a rear view of the trim plate of FIG. 8.

FIG. 10 is a rear perspective view of the trim plate of FIG. 8.

FIGS. 24-34 are front perspective views detailing an installation process for mounting the thermostat assembly of FIG. 5 to a horizontal junction box.

DETAILED DESCRIPTION

Overview

Referring now generally to the FIGURES, a thermostat assembly that can be used to control an HVAC system is provided. The thermostat assembly can implemented as a smart hub and can be connected to any of a variety of controllable systems and devices. For example, the thermostat assembly can be connected to an HVAC system to control the climate within a space. The thermostat assembly can be implemented in any of a variety of environments (e.g., a home, a building, a classroom, a hotel, a healthcare facility, an office, a vehicle, etc.) and used to monitor, control, and/or facilitate user interaction with controllable systems or devices in such environments. The thermostat assemblies shown and described include mounting and positioning features that facilitate an easier installation process than conventional wall mounted thermostat assemblies.

Commercial And Residential HVAC Systems With A Thermostat

Figure 1:
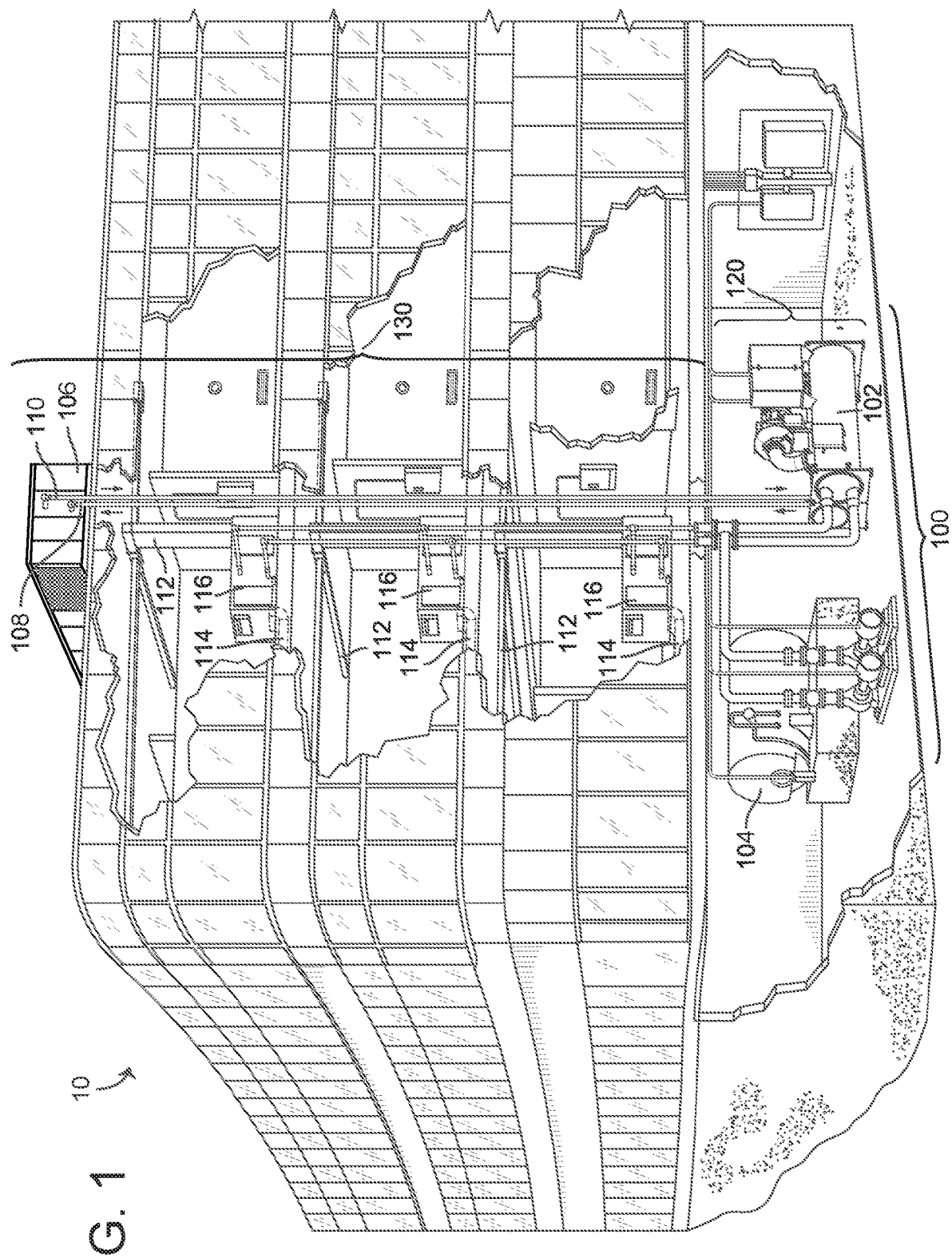
FIG. 1 is a perspective schematic drawing of a building equipped with a HVAC system, according to an exemplary embodiment.

Referring now to FIG. 1, an exemplary building management system (BMS) and HVAC system in which the systems and methods of the present invention can be implemented are shown, according to an exemplary embodiment. In FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes an HVAC system 100. HVAC system 100 can include HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 can provide a heated or chilled fluid to an air handling unit of airside system 130. Airside system 130 can use the heated or chilled fluid to heat or cool an airflow provided to building 10.

HVAC system 100 is shown to include a chiller 102, a boiler 104, and a rooftop air handling unit (AHU) 106. Waterside system 120 can use boiler 104 and chiller 102 to heat or cool a working fluid (e.g., water, glycol, etc.) and can circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 can add heat to the circulated fluid, for example, by burning a combustible material (e.g., natural gas) or using an electric heating element. Chiller 102 can place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 can place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 can transfer heat between the airflow and the working fluid to provide heating or cooling for the airflow. For example, AHU 106 can include one or more fans or blowers configured to pass the airflow over or through a heat exchanger containing the working fluid. The working fluid can then return to chiller 102 or boiler 104 via piping 110.

Airside system 130 can deliver the airflow supplied by AHU 106 (i.e., the supply airflow) to building 10 via air supply ducts 112 and can provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 can receive input from sensors located within AHU 106 and/or within the building zone and can adjust the flow rate, temperature, or other attributes of the supply airflow through AHU 106 to achieve set-point conditions for the building zone.

Figure 2:
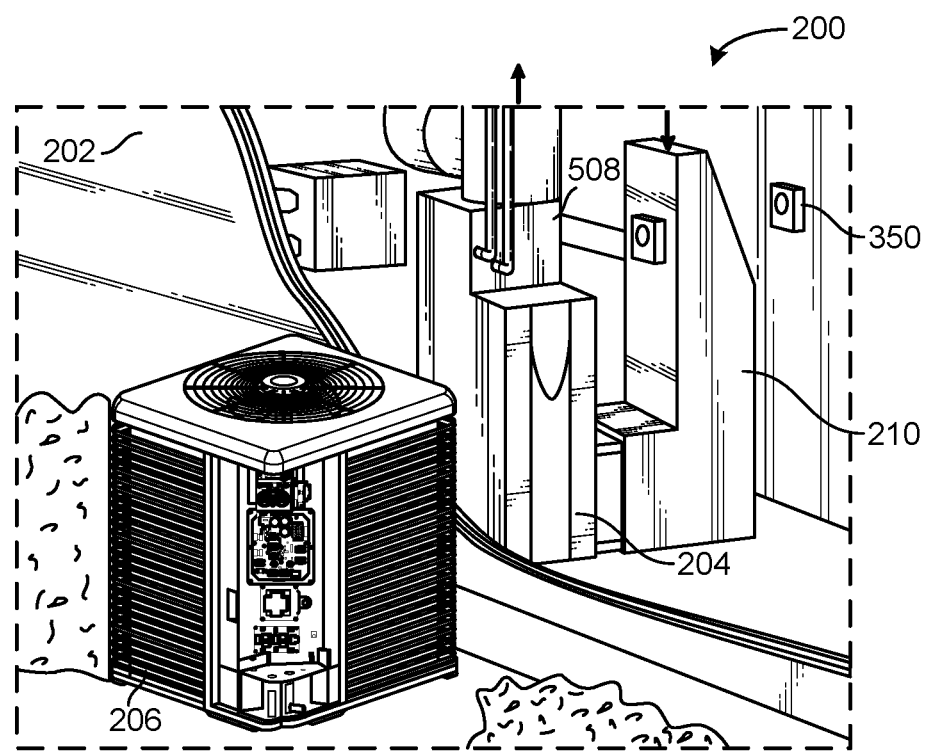
FIG. 2 is a drawing of a cantilevered thermostat with a transparent display, according to an exemplary embodiment.

Referring now to FIG. 2, a residential heating and cooling system 200 is shown, according to an exemplary embodiment. The residential heating and cooling system 200 may provide heated and cooled air to a residential structure. Although described as a residential heating and cooling system 200, embodiments of the systems and methods described herein can be utilized in a cooling unit or a heating unit in a variety of applications include commercial HVAC units (e.g., roof top units). In general, a residence 202 includes refrigerant conduits that operatively couple an indoor unit 204 to an outdoor unit 206. Indoor unit 204 may be positioned in a utility space, an attic, a basement, and so forth. Outdoor unit 206 is situated adjacent to a side of residence 202. Refrigerant conduits transfer refrigerant between indoor unit 204 and outdoor unit 206, typically transferring primarily liquid refrigerant in one direction and primarily vaporized refrigerant in an opposite direction.

When the system 200 shown in FIG. 2 is operating as an air conditioner, a coil in outdoor unit 206 serves as a condenser for recondensing vaporized refrigerant flowing from indoor unit 204 to outdoor unit 206 via one of the refrigerant conduits. In these applications, a coil of the indoor unit 204, designated by the reference numeral 208, serves as an evaporator coil. Evaporator coil 208 receives liquid refrigerant (which may be expanded by an expansion device, not shown) and evaporates the refrigerant before returning it to outdoor unit 206.

Outdoor unit 206 draws in environmental air through its sides, forces the air through the outer unit coil using a fan, and expels the air. When operating as an air conditioner, the air is heated by the condenser coil within the outdoor unit 206 and exits the top of the unit at a temperature higher than it entered the sides. Air is blown over indoor coil 208 and is then circulated through residence 202 by means of ductwork 210, as indicated by the arrows entering and exiting ductwork 210. The overall system 200 operates to maintain a desired temperature as set by thermostat 350. When the temperature sensed inside the residence 302 is higher than the set point on the thermostat 350 (with the addition of a relatively small tolerance), the air conditioner will become operative to refrigerate additional air for circulation through the residence 202. When the temperature reaches the set point (with the removal of a relatively small tolerance), the unit can stop the refrigeration cycle temporarily.

In some embodiments, the system 200 configured so that the outdoor unit 206 is controlled to achieve a more elegant control over temperature and humidity within the residence 202. The outdoor unit 206 is controlled to operate components within the outdoor unit 206, and the system 200, based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

Figure 3:
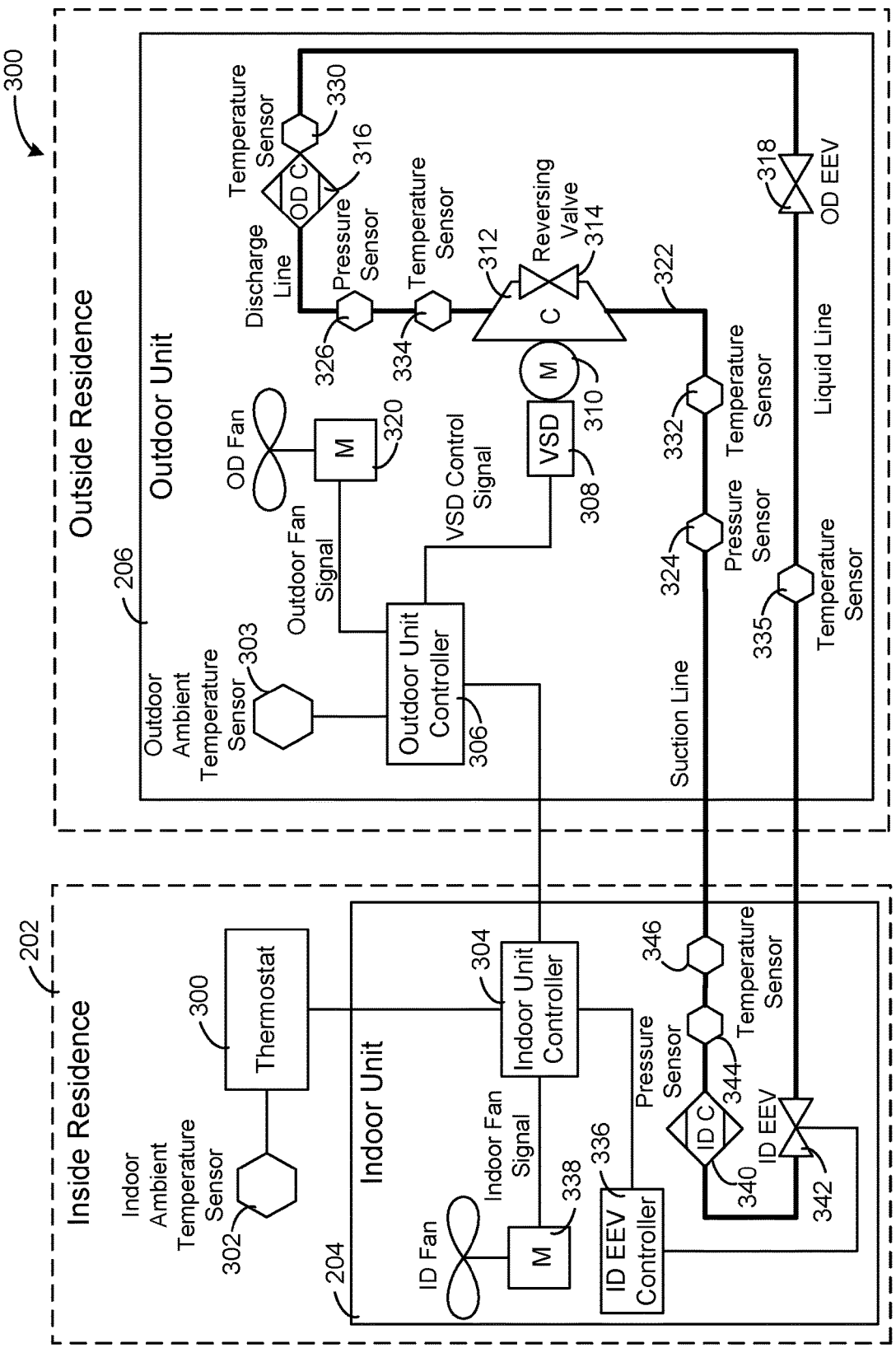
FIG. 3 is a perspective schematic drawing of a building equipped with a residential heating and cooling system and the thermostat of FIG. 2, according to an exemplary embodiment.

Referring now to FIG. 3, an HVAC system 300 is shown according to an exemplary embodiment. Various components of system 300 are located inside residence 202 while other components are located outside residence 202. Outdoor unit 206, as described with reference to FIG. 2, is shown to be located outside residence 202 while indoor unit 204 and thermostat 350 are shown to be located inside the residence 202. In various embodiments, the thermostat 350 can cause the indoor unit 204 and the outdoor unit 206 to heat residence 202. In some embodiments, the thermostat 350 can cause the indoor unit 204 and the outdoor unit 206 to cool the residence 202. In other embodiments, the thermostat 350 can command an airflow change within the residence 202 to adjust the humidity within the residence 202.

The thermostat 350 can be configured to generate control signals for indoor unit 204 and/or outdoor unit 206. The thermostat 350 is shown to be connected to an indoor ambient temperature sensor 302, and an outdoor unit controller 306 is shown to be connected to an outdoor ambient temperature sensor 603. The indoor ambient temperature sensor 302 and the outdoor ambient temperature sensor 603 may be any kind of temperature sensor (e.g., thermistor, thermocouple, etc.). The thermostat 350 may measure the temperature of residence 202 via the indoor ambient temperature sensor 302. Further, the thermostat 350 can be configured to receive the temperature outside residence 202 via communication with the outdoor unit controller 306. In various embodiments, the thermostat 350 generates control signals for the indoor unit 204 and the outdoor unit 206 based on the indoor ambient temperature (e.g., measured via indoor ambient temperature sensor 302), the outdoor temperature (e.g., measured via the outdoor ambient temperature sensor 603), and/or a temperature set point.

The indoor unit 204 and the outdoor unit 206 may be electrically connected. Further, indoor unit 204 and outdoor unit 206 may be coupled via conduits 322. The outdoor unit 206 can be configured to compress refrigerant inside conduits 322 to either heat or cool the building based on the operating mode of the indoor unit 204 and the outdoor unit 206 (e.g., heat pump operation or air conditioning operation). The refrigerant inside conduits 322 may be any fluid that absorbs and extracts heat. For example, the refrigerant may be hydro fluorocarbon (HFC) based R-410A, R-407C, and/or R-134a.

The outdoor unit 206 is shown to include the outdoor unit controller 306, a variable speed drive 308, a motor 310 and a compressor 312. The outdoor unit 206 can be configured to control the compressor 312 and to further cause the compressor 312 to compress the refrigerant inside conduits 322. In this regard, the compressor 312 may be driven by the variable speed drive 308 and the motor 310. For example, the outdoor unit controller 306 can generate control signals for the variable speed drive 308. The variable speed drive 308 (e.g., an inverter, a variable frequency drive, etc.) may be an AC-AC inverter, a DC-AC inverter, and/or any other type of inverter. The variable speed drive 308 can be configured to vary the torque and/or speed of the motor 310 which in turn drives the speed and/or torque of compressor 312. The compressor 312 may be any suitable compressor such as a screw compressor, a reciprocating compressor, a rotary compressor, a swing link compressor, a scroll compressor, or a turbine compressor, etc.

In some embodiments, the outdoor unit controller 306 is configured to process data received from the thermostat 350 to determine operating values for components of the system 300, such as the compressor 312. In one embodiment, the outdoor unit controller 306 is configured to provide the determined operating values for the compressor 312 to the variable speed drive 308, which controls a speed of the compressor 312. The outdoor unit controller 306 is controlled to operate components within the outdoor unit 206, and the indoor unit 204, based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

In some embodiments, the outdoor unit controller 306 can control a reversing valve 314 to operate system 300 as a heat pump or an air conditioner. For example, the outdoor unit controller 306 may cause reversing valve 314 to direct compressed refrigerant to the indoor coil 208 while in heat pump mode and to an outdoor coil 316 while in air conditioner mode. In this regard, the indoor coil 208 and the outdoor coil 316 can both act as condensers and evaporators depending on the operating mode (i.e., heat pump or air conditioner) of system 300.

Further, in various embodiments, outdoor unit controller 306 can be configured to control and/or receive data from an outdoor electronic expansion valve (EEV) 518. The outdoor electronic expansion valve 518 may be an expansion valve controlled by a stepper motor. In this regard, the outdoor unit controller 306 can be configured to generate a step signal (e.g., a PWM signal) for the outdoor electronic expansion valve 518. Based on the step signal, the outdoor electronic expansion valve 518 can be held fully open, fully closed, partial open, etc. In various embodiments, the outdoor unit controller 306 can be configured to generate step signal for the outdoor electronic expansion valve 518 based on a subcool and/or superheat value calculated from various temperatures and pressures measured in system 300. In one embodiment, the outdoor unit controller 306 is configured to control the position of the outdoor electronic expansion valve 518 based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

The outdoor unit controller 306 can be configured to control and/or power outdoor fan 320. The outdoor fan 320 can be configured to blow air over the outdoor coil 316. In this regard, the outdoor unit controller 306 can control the amount of air blowing over the outdoor coil 316 by generating control signals to control the speed and/or torque of outdoor fan 320. In some embodiments, the control signals are pulse wave modulated signals (PWM), analog voltage signals (i.e., varying the amplitude of a DC or AC signal), and/or any other type of signal. In one embodiment, the outdoor unit controller 306 can control an operating value of the outdoor fan 320, such as speed, based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

The outdoor unit 206 may include one or more temperature sensors and one or more pressure sensors. The temperature sensors and pressure sensors may be electrical connected (i.e., via wires, via wireless communication, etc.) to the outdoor unit controller 306. In this regard, the outdoor unit controller 306 can be configured to measure and store the temperatures and pressures of the refrigerant at various locations of the conduits 322. The pressure sensors may be any kind of transducer that can be configured to sense the pressure of the refrigerant in the conduits 322. The outdoor unit 206 is shown to include pressure sensor 324. The pressure sensor 324 may measure the pressure of the refrigerant in conduit 322 in the suction line (i.e., a predefined distance from the inlet of compressor 312). Further, the outdoor unit 206 is shown to include pressure sensor 326. The pressure sensor 326 may be configured to measure the pressure of the refrigerant in conduits 322 on the discharge line (e.g., a predefined distance from the outlet of compressor 312).

The temperature sensors of outdoor unit 206 may include thermistors, thermocouples, and/or any other temperature sensing device. The outdoor unit 206 is shown to include temperature sensor 330, temperature sensor 332, temperature sensor 334, and temperature sensor 336. The temperature sensors (i.e., temperature sensor 330, temperature sensor 332, temperature sensor 335, and/or temperature sensor 346) can be configured to measure the temperature of the refrigerant at various locations inside conduits 322.

Referring now to the indoor unit 204, the indoor unit 204 is shown to include indoor unit controller 304, indoor electronic expansion valve controller 336, an indoor fan 338, an indoor coil 340, an indoor electronic expansion valve 342, a pressure sensor 344, and a temperature sensor 346. The indoor unit controller 304 can be configured to generate control signals for indoor electronic expansion valve controller 342. The signals may be set points (e.g., temperature set point, pressure set point, superheat set point, subcool set point, step value set point, etc.). In this regard, indoor electronic expansion valve controller 336 can be configured to generate control signals for indoor electronic expansion valve 342. In various embodiments, indoor electronic expansion valve 342 may be the same type of valve as outdoor electronic expansion valve 318. In this regard, indoor electronic expansion valve controller 336 can be configured to generate a step control signal (e.g., a PWM wave) for controlling the stepper motor of the indoor electronic expansion valve 342. In this regard, indoor electronic expansion valve controller 336 can be configured to fully open, fully close, or partially close the indoor electronic expansion valve 342 based on the step signal.

Indoor unit controller 304 can be configured to control indoor fan 338. The indoor fan 338 can be configured to blow air over indoor coil 340. In this regard, the indoor unit controller 304 can control the amount of air blowing over the indoor coil 340 by generating control signals to control the speed and/or torque of the indoor fan 338. In some embodiments, the control signals are pulse wave modulated signals (PWM), analog voltage signals (i.e., varying the amplitude of a DC or AC signal), and/or any other type of signal. In one embodiment, the indoor unit controller 304 may receive a signal from the outdoor unit controller indicating one or more operating values, such as speed for the indoor fan 338. In one embodiment, the operating value associated with the indoor fan 338 is an airflow, such as cubic feet per minute (CFM). In one embodiment, the outdoor unit controller 306 may determine the operating value of the indoor fan based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

The indoor unit controller 304 may be electrically connected (e.g., wired connection, wireless connection, etc.) to pressure sensor 344 and/or temperature sensor 346. In this regard, the indoor unit controller 304 can take pressure and/or temperature sensing measurements via pressure sensor 344 and/or temperature sensor 346. In one embodiment, pressure sensor 344 and temperature sensor 346 are located on the suction line (i.e., a predefined distance from indoor coil 340). In other embodiments, the pressure sensor 344 and/or the temperature sensor 346 may be located on the liquid line (i.e., a predefined distance from indoor coil 340).

Figure 4:
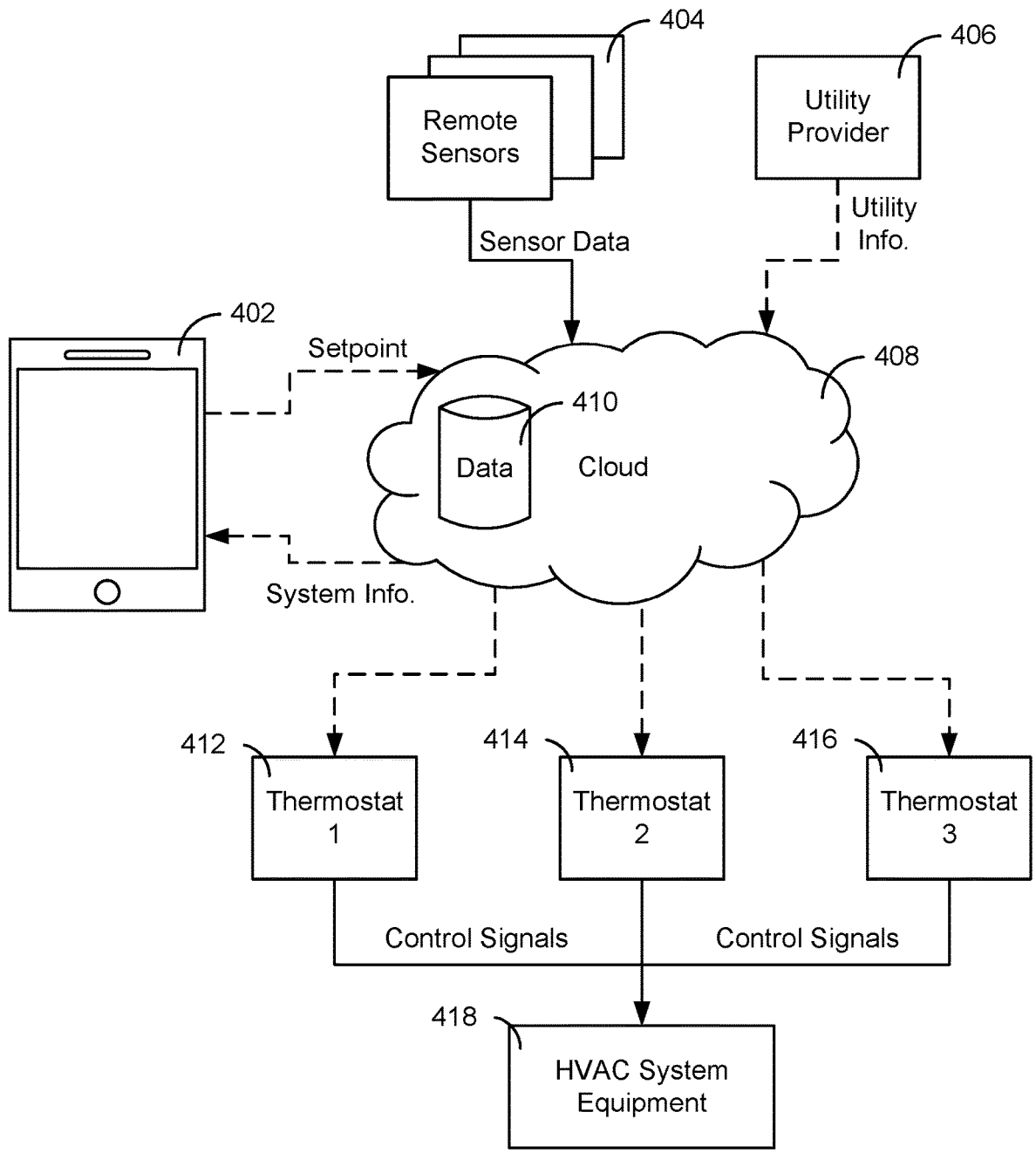
FIG. 4 is a block diagram of a thermostat control system which can be used in the system of FIG. 3, according to some embodiments.

Referring now to FIG. 4, a control system 400 is shown. Control system 400 is shown to include user device 402, remote sensors 404, utility provider 406, cloud 408, thermostats 412-416, and HVAC system 418. Control system 400 may include some or all of the functionality of HVAC system 300.

User device 402 may be any device capable of providing a user interface to a user (e.g., cellphone, tablet, laptop, computer, etc.). In some embodiments, user device 402 is a cellphone capable of downloading a thermostat application and providing that thermostat application to a user via the user interface of the cell phone.

Remote sensors 404 can be any type of device capable of recording/monitoring environmental data and transmitting that data back to a processing device. In some embodiments, remote sensors 404 record temperature data in one or more building zones (e.g., bathroom, office, basement, etc.) and provide the temperature data to a processing device. In some embodiments, the processing device (e.g., controller) may be located in cloud 408 as shown in FIG. 4. In other embodiments, the processing and controls of control system 400 is performed by an HVAC controller, such as controller 304, controller 306, or any other various controllers, either alone or in combination, as shown in FIG. 3.

Utility provider 406 can be any company capable of providing a utility (e.g., electricity, water, etc.) to a residence or building. In some embodiments, utility provider 406 provides one or more utilities to the residence in which control system 400 is located. Utility provider 406 may further provide utility information to a processing device in control system 400. For example, utility provider 406 may provide on and off-peak rates, utility benefits, and other promotional offers to user device 402 on a thermostat application, via a user interface on user device 402. The utility information may reside in cloud 408 until user device 402 requests the utility information.

Cloud 408 may include programming that relies on sharing computing resources rather than having local devices (e.g., local serves, local computers, etc.) handle applications. Cloud 410 may be responsible for sharing any applications, storage, services, or any other computational processing required in control system 400. In some embodiments, cloud 410 is a model for enabling on-demand network access to a shared pool of configurable computing resources (e.g., networks, servers, storage, applications, and services) that can be rapidly provisioned. Cloud 410 is shown to include data storage 410. Data storage 410 may store data from one or more elements of control system 400 (e.g., utility provider 406, remote sensors 404, etc.).

Thermostats 412-416 may be identical or substantially similar to one or more thermostats discloses in the present application (e.g., thermostat 350, thermostat 500). In some embodiments, thermostats 412-416 receive temperature setpoints from a controller within cloud 408, and provide control signals to various HVAC equipment (chillers, heaters, dampers, etc.) within HVAC system 418. Thermostats 412-416 may send information to and receive information from user device 402. For example, user device 402 may provide a temperature setpoint to thermostat 412, via the cloud 408.

Referring now to FIGS. 5-11, a thermostat assembly 500 is provided. The thermostat assembly 500 includes, generally, a thermostat 502 and a wall mounting assembly 504. The wall mounting assembly 504 includes a trim plate 506, a back housing 508, and one or more fasteners 510 that can be used to anchor or otherwise secure the trim plate 506 and/or back housing 508 to a wall or similar structure. As detailed below, the wall mounting assembly 504 can act as a universal mounting structure that can be used to secure the thermostat assembly 500 to any of a standard wall, a vertical junction box, and a horizontal junction box.

Figure 5:
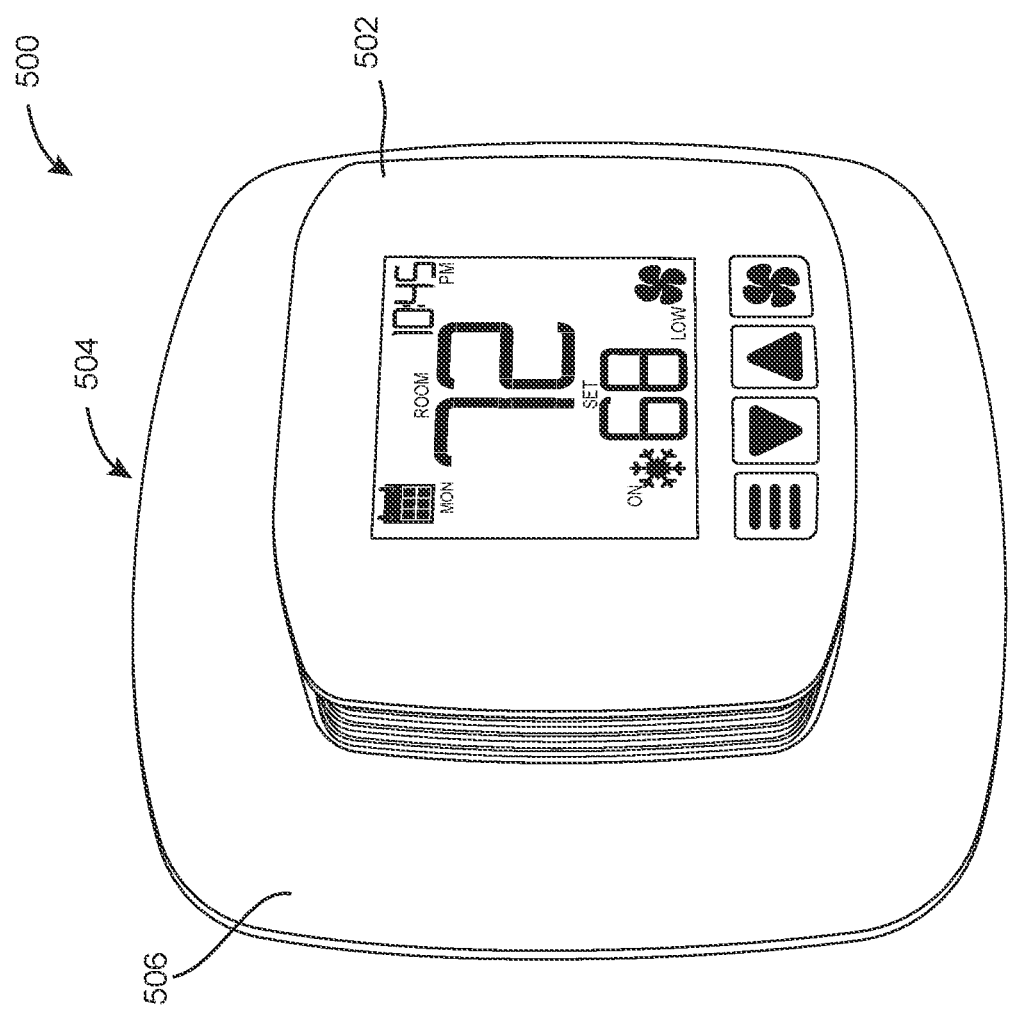
FIG. 5 is a front perspective view of a thermostat assembly, according to an exemplary embodiment.
Figure 6:
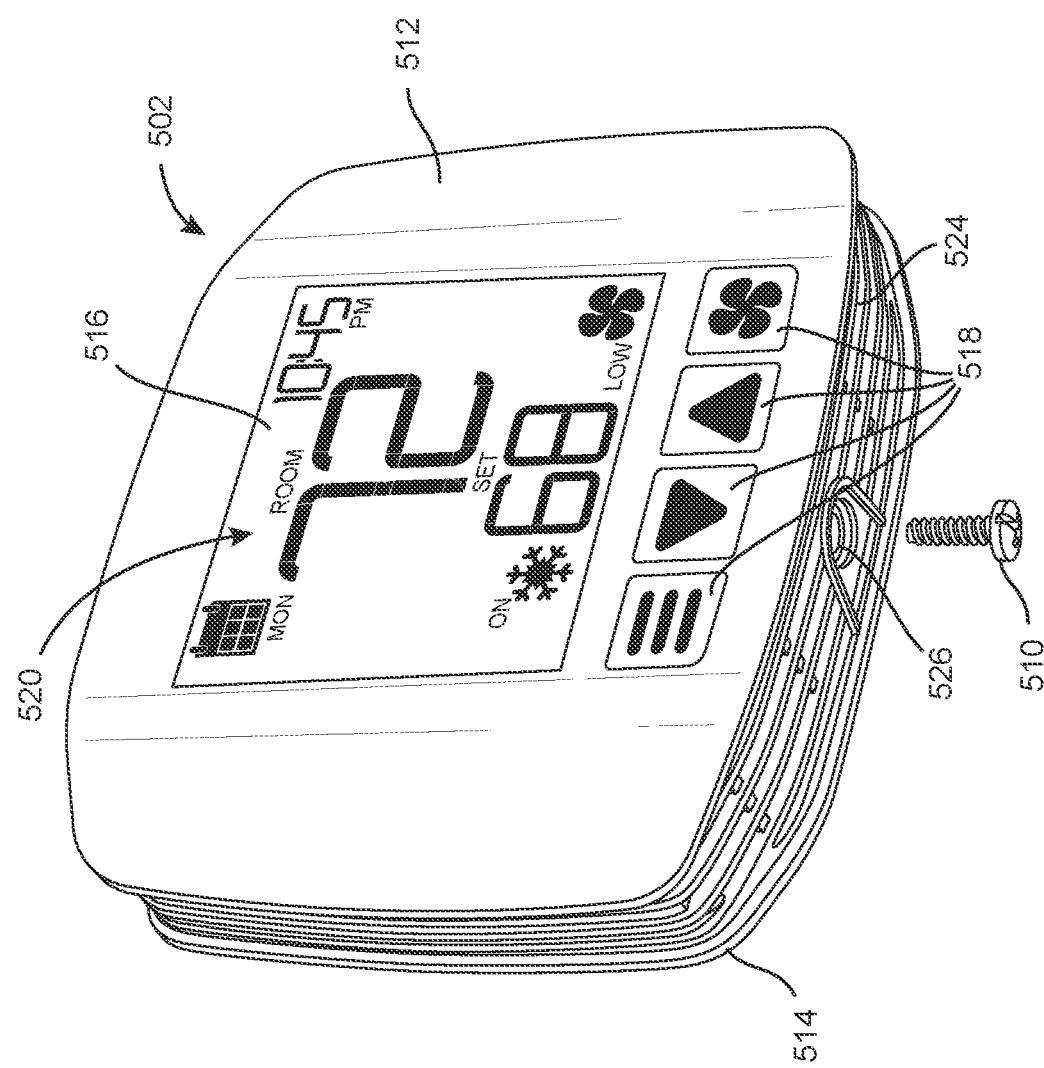
FIG. 6 is a front, bottom perspective view of a thermostat within the thermostat assembly of FIG. 5, shown in isolation.
Figure 7:
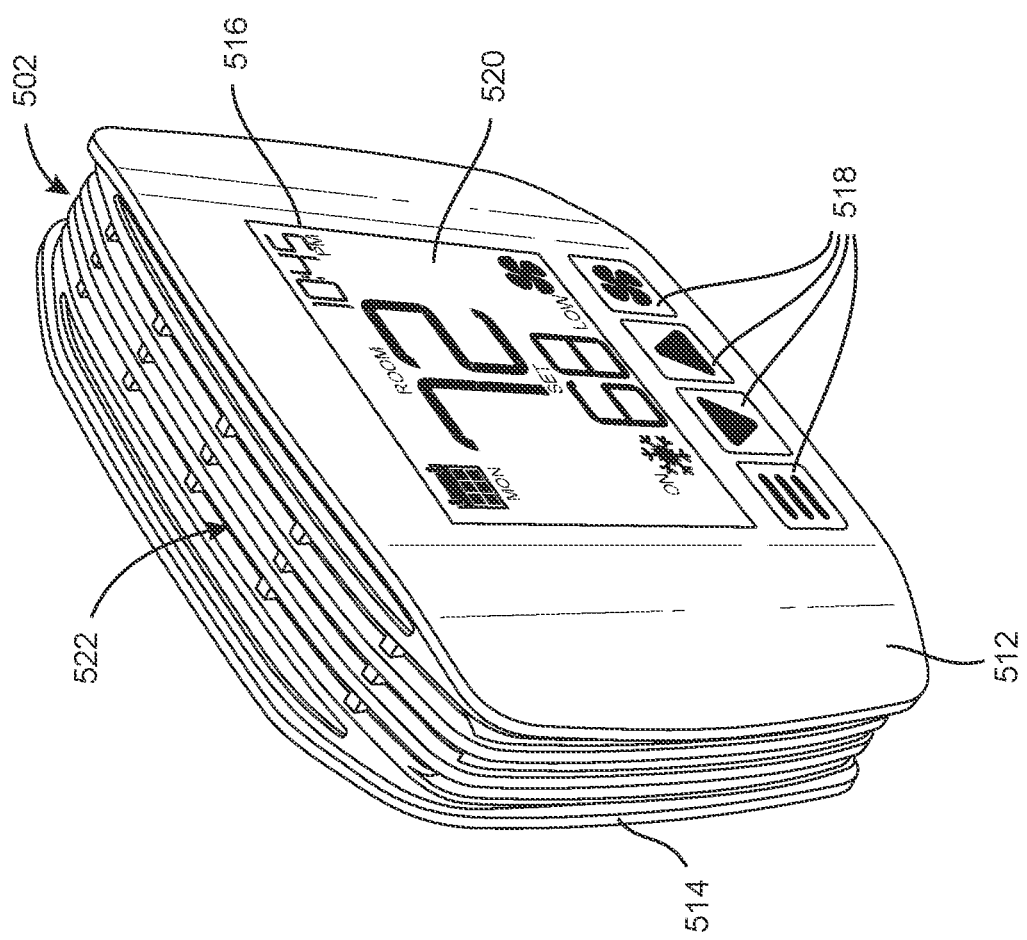
FIG. 7 is a front, top perspective view of the thermostat of FIG. 6.

With specific reference to FIGS. 5-7, the thermostat 502 has a rectangular box-like body defined by a front plate 512 and a back plate 514 opposite from and spaced apart from the front plate 512. The thermostat 502 can be formed of a molded (e.g., injection molded) polymeric material, and can include one or more additional inlays molded integrally within the thermostat 502. The front plate 512 includes a display 516 and a plurality of inputs 518 that can be actuated to produce different controlling functions. The display 516 can display a graphical user interface (GUI) 520 that provides a series of control options that can be performed by the thermostat 502 or otherwise communicated to an HVAC system to adjust the climate within an area. The inputs 518 can be a series of buttons, for example, which can allow a user to readily select different options presented on the GUI 520. In some embodiments, the inputs 518 are touch screen buttons that include icons to indicate the type of function that is performed by actuating the inputs 518 (e.g., arrows, menu button, or fan control). Heat generated from the electrical components within the thermostat 502 can escape through top and bottom vents 522, 524 formed within the thermostat body between the front plate 512 and back plate 514. A mounting hole 526 can be positioned within the bottom vent 524 to secure the thermostat to the wall mounting assembly 504.

Figure 8:
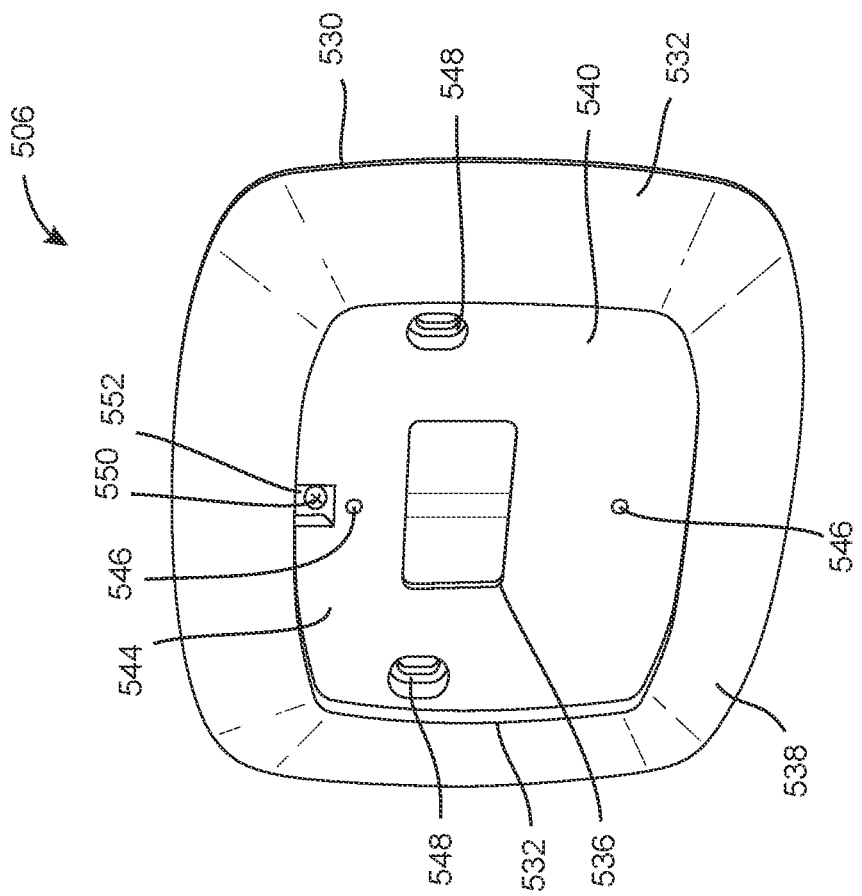
FIG. 8 is a front perspective view of a trim plate within the thermostat assembly of FIG. 5.

The thermostat 502 is sized to interface with the wall mounting assembly 504, and can be received within the trim plate 506 and/or directly coupled to back housing 508. With reference now to FIGS. 8-10, the trim plate 506 is shown in additional detail. The trim plate 506 has a body 530 defined by a first end 532 and a second end 534 opposite the first end 532. The first end 532 defines a front section that interfaces with the thermostat 502 and the second end 534 defines a rear section that includes a series of mounting features that help to position and secure the trim plate 506 relative to a wall. A passageway 536 extends through the body 530, from the rear section to the front section, to receive wiring therethrough.

The first end 532 of the trim plate 506 is defined, generally, by a raised perimeter section 538 surrounding a recessed section 540. The raised perimeter section 538 forms a ring-like shape having a gently-curving surface 542 that extends upwardly and inwardly away from the second end 534, toward the recessed section 540. The recessed section 540 is formed inward from and offset from the surface 542. The recessed section 540 can be defined by a flat surface 544 sized to be complimentary with the thermostat 502. In some examples, the recessed section 540 is designed to form a clearance fit with the thermostat 502.

Mounting and locating features are formed in the body 530 of the trim plate 506 to facilitate the installation of the thermostat assembly 500 onto a wall. The mounting and locating features can include an array of through holes 546, for example, which can be used to secure the trim plate to a junction box or wall. The holes 546 can be positioned outward from the passageway 536, and can be aligned along a centerline X-X of the passageway 536. A pair of elongated holes 548 can be formed through the body 530 to further aid in the positioning of the trim plate 506, as explained below. In some examples, each of the through holes are further defined by bosses extending rearwardly away from the back side of the recessed section 540 toward the second end 534 of the body 530 of the trim plate 506.

The trim plate 506 also includes a positioning feature 550 formed through the body 530. The positioning feature 550 is formed outward from the passageway and is spaced apart from the through holes 546. In some examples, the positioning feature 550 is positioned along the centerline X-X of the passageway 536. The positioning feature 550 can be formed of both positive and negative features. An aperture 552 is formed within and through the flat surface 544 of the recessed section 540. The aperture 552 can be rectangular and can be sized to form a clearance fit around a fastener head. The aperture 552 can serve as a window that allows a user to align the trim plate 506 relative to a junction box prior to installment.

The positioning feature 550 is further defined by walls 554, 556 extending rearwardly away from the front section toward the rear section of the body 530. The walls 554, 556 partially surround and extend away from the aperture 552. The walls 554, 556 are positioned on opposite sides of the aperture 552, and extend approximately parallel to one another to define a pocket 558. In some examples, the walls 554, 556 are part of a single, continuous U-shaped structure that includes a rounded stop 560. The rounded stop 560 can be formed as a semi-circular section that is offset upwardly away from the aperture 552.

The pocket 558, which is defined by the portion of the walls 554, 556 and rounded stop 560 offset upwardly away from the aperture 552, allows the trim plate 506 to receive a portion of a fastener to hang the trim plate 506 onto a junction box. As depicted in FIGS. 9-10, the pocket 558 can be further defined by a cover 562. The cover 562 extends inwardly over a portion of the pocket 558, and includes tapered surfaces 564, 566 that extend inwardly away from each of the walls 554, 556, respectively, to define a funnel. Beyond the tapered surfaces 564, 566 and adjacent the rounded stop 560, a terminal portion 568 of the pocket 558 is formed. The overhang of the cover 562 relative to the walls 554, 556 and rounded stop 560 creates a narrowed terminal portion 568 that is sized to form a clearance fit around the body of a fastener (e.g., fastener 570, shown in FIG. 10) that overlaps and prevents the head of the fastener from being removed from the pocket 558. The funnel shape of the cover 562 provides a self-alignment function that centers the trim plate 506 relative to a fastener (and therefore, to a junction box supporting the fastener). When a fastener head is received within the pocket 558, the funnel-shaped cover 562 urges the trim plate 506 into alignment by directing the fastener into a position along the centerline X-X of the passageway 536 as the fastener approaches the terminal section 568 of the pocket 558. In some examples, the walls 554, 556, curved stop 560, and cover 562 are formed as a single, continuous feature.

Figure 11:
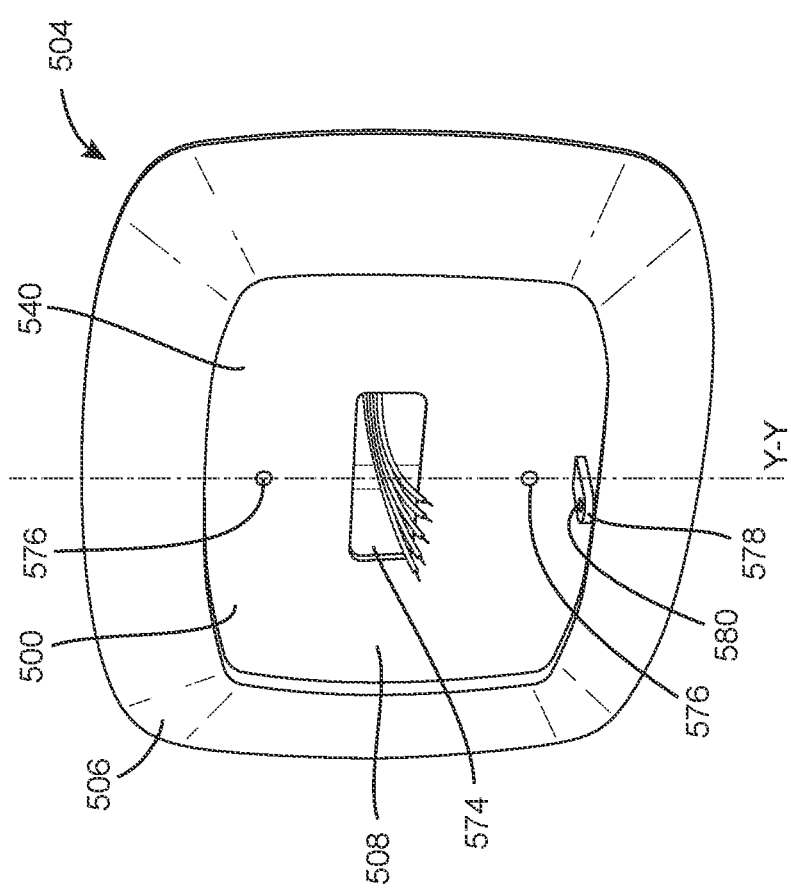
FIG. 11 is a front perspective view of the thermostat assembly of FIG. 5, with the thermostat of FIG. 6 removed.

As depicted in FIG. 11, the recessed section 540 of the trim plate 506 can receive the back housing 508. The back housing 508 is defined by a body 572 having a generally rectangular shape that is complimentary to the recessed section 540. In some examples, the body 572 of the back housing 508 forms a tight clearance fit within the recessed section 540 that allows the back housing 508 to remain securely within the trim plate 506 without the use of fasteners. Like the trim plate 506, the back housing 508 includes a rectangular passageway 574 formed through the body 572 for receiving wiring. Through holes 576 positioned along a centerline Y-Y of the back housing 508 can be used to help secure the back housing 508 to the trim plate 506 or directly to a wall. When installed within the trim plate 506, the centerline Y-Y of the back housing 508 and the centerline X-X of the trim plate 506 are aligned so that the passageway 574 and passageway 536 form a continuous pathway through the wall mounting assembly 504. The back housing 508 also includes a mounting tab 578 extending outwardly away (e.g., perpendicularly) from the body 572. A hole 580 is formed through the mounting tab 578 that can receive a fastener that is used to secure the back housing 508 to the thermostat 502. As explained below, the fastener can extend through the hole 580 and be threaded into the mounting hole 526 of the thermostat 502.

Figure 12:
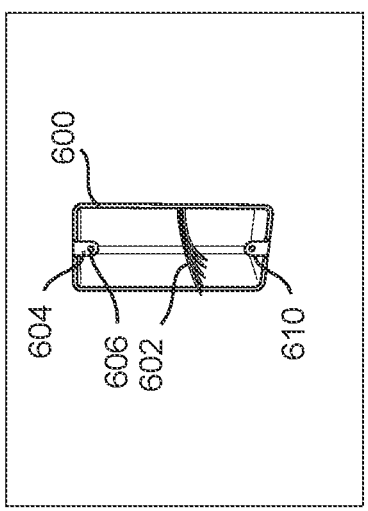
FIGS. 12-23 are front perspective views detailing an installation process for mounting the thermostat assembly of FIG. 5 to a vertical junction box.
Figure 13:
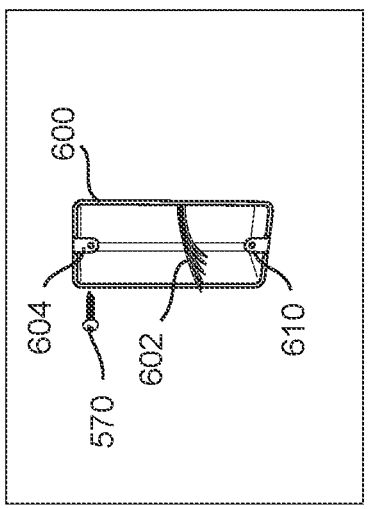
Figure 14:
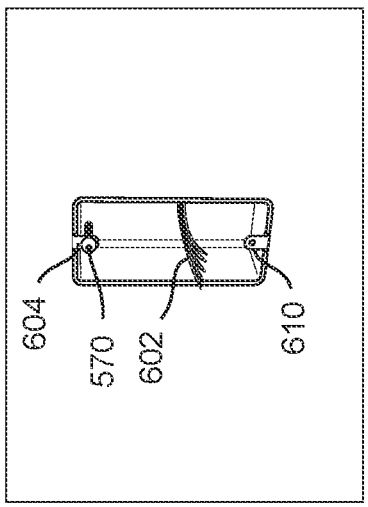
Figure 15:
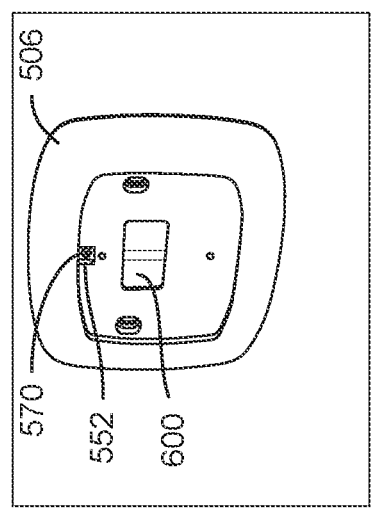
Figure 16:
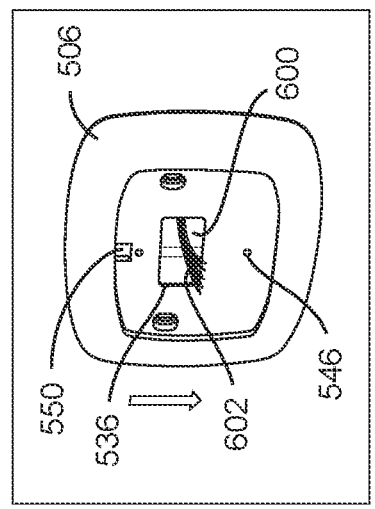
Figure 17:
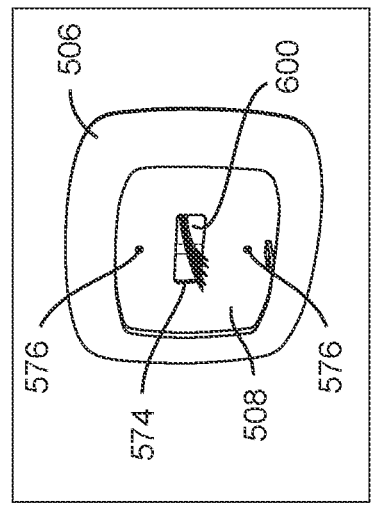

With additional reference to FIGS. 12-23 and continued reference to FIGS. 5-11, an installation process for mounting the thermostat assembly 500 to a vertical junction box 600 is depicted. Initially, as shown in FIG. 12, the wiring 602 within the vertical junction box 600 can be adjusted and positioned within the vertical junction box 600. Next, a fastener 570 can be passed into an upper mounting tab 604 of the vertical junction box 600. The fastener 570 can be urged into a hole 606 formed within the upper mounting tab 604 to a position approximately 2-3 millimeters short of the fastener head engaging the upper mounting tab 604, as shown in FIGS. 13-14. Using the fastener 570 as a guide, the trim plate 506 can be positioned relative to the vertical junction box 600. The trim plate 506 can be urged forward so that the head of the fastener 570 is passed through and into the aperture 552, as shown in FIG. 15. With the fastener 570 aligned relative to the aperture 552 within the trim plate 506, the trim plate 506 can be pushed downward to move the fastener 570 into the pocket 558 of the positioning feature 550, as shown in FIG. 16. Continued downward movement of the trim plate 506 relative to the vertical junction box 600 urges the fastener 570 toward the funnel-shaped cover 562, which centers the trim plate 506 relative to the fastener 570 until the trim plate 506 finally comes to rest with the fastener positioned within the terminal section 568 of the pocket 558. The wiring 602 within the vertical junction box 600 can then be fed through the passageway 536 of the trim plate 506. With the wiring 602 exposed and the trim plate 506 positioned and hanging upon the vertical junction box 600, the back housing 508 can be installed, as shown in FIG. 17. As explained above, the back housing 508 is received within the recessed section 540 of the trim plate 506. The through holes 576 of the back housing 508 are aligned with the through holes 546 of the trim plate 506.

Figure 18:
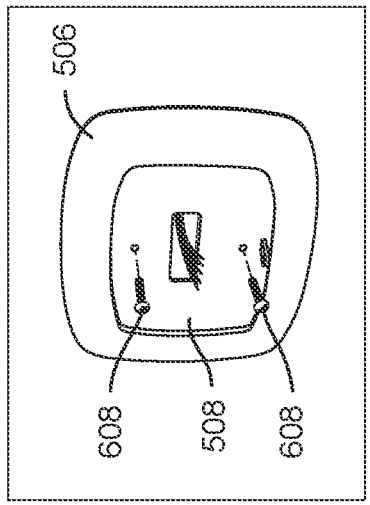
Figure 19:
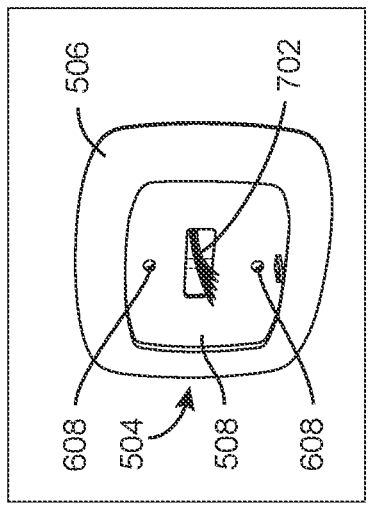
Figure 20:
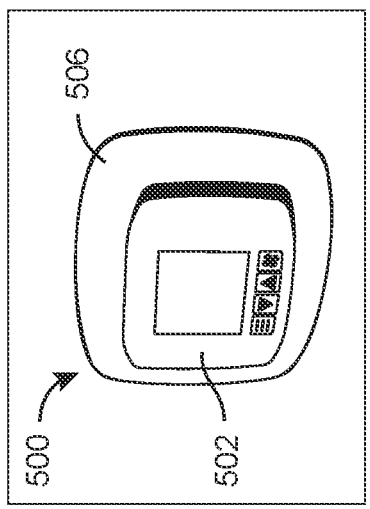
Figure 21:
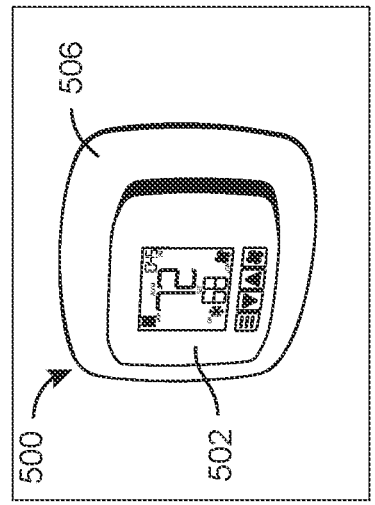
Figure 22:
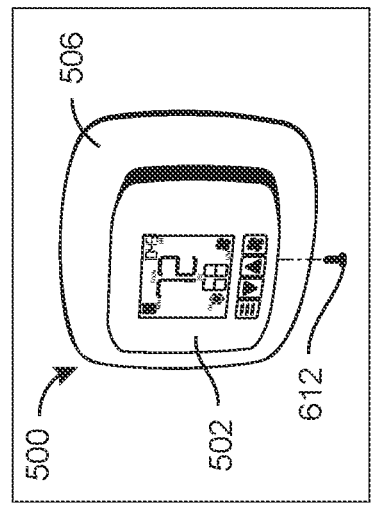
Figure 23:
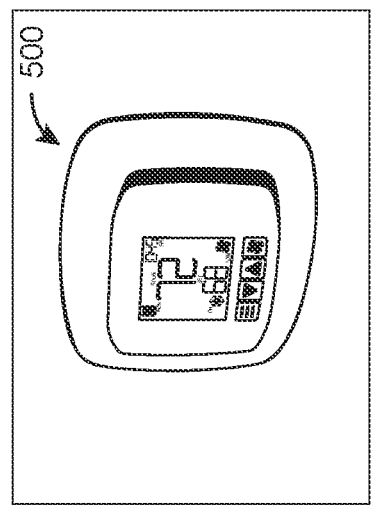
Figure 35:
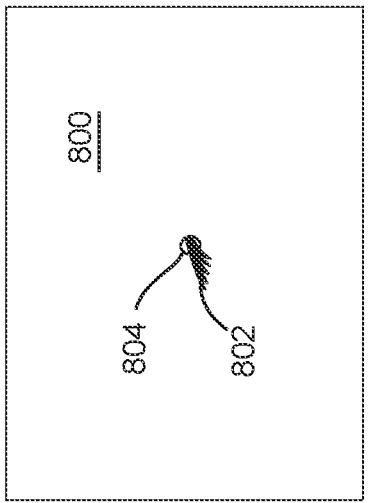
FIGS. 35-40 are front perspective views detailing an installation process for mounting the thermostat assembly of FIG. 5 to a wall without using the trim plate of FIG. 8.

With the back housing 508 installed within the trim plate 506, additional mounting fasteners 608 can be used to secure the back housing 508 to the trim plate 506. In some examples, the through holes 546 of the trim plate 506 are threaded so that fasteners 608 can be used to anchor the back housing 508 within the trim plate 506, as shown in FIGS. 18-19. The bottom fastener 608 passes through each of the back housing 508, the trim plate 506, and a lower mounting tab 610 of the junction box 600 to complete the installation process of the wall mounting assembly 504. The wiring 602 can then be connected to the thermostat 502, which is then placed into electrical communication with a power source and/or HVAC equipment to be controlled. The thermostat 502 is at least partially received within the recessed section 540 of the trim plate 506, and engages the back housing 508, as shown in FIGS. 20-21. A lock screw 612 can then be passed upwardly through the hole 580 within the mounting tab 578 of the back housing 508 and threaded into the mounting hole 526 of the thermostat 502 to secure the thermostat 502 into place within the thermostat assembly 500, as depicted in FIGS. 22-23.

The universal nature of the trim plate 506 allows the thermostat assembly 500 to be installed into a horizontal junction box 700 using a similar process, as depicted by FIGS. 24-34. Initially, the wiring 702 is aligned within the horizontal junction box 700, as shown in FIG. 24. The trim plate 506 can then be positioned relative to the horizontal junction box 700. The elongated holes 548 of the trim plate 506 can be aligned with holes 704, 706 formed through mounting tabs 708, 710 formed on opposite ends of the horizontal junction box 700. With the holes 548 aligned with the holes 704, 706, the trim plate 506 can be secured in place relative to the horizontal junction box 700. As shown in FIGS. 25-26, fasteners 712, 714 can be urged through the trim plate 506 and into the holes 704, 706. With the trim plate 506 installed, the wiring 702 can be passed through the passageway 536 of the trim plate 506, as depicted in FIG. 27.

With the wiring 702 exposed and the trim plate 506 positioned and hanging upon the horizontal junction box 700, the back housing 508 can be installed, as shown in FIG. 28. As explained above, the back housing 508 is received within the recessed section 540 of the trim plate 506. The through holes 576 of the back housing 508 are aligned with the through holes 546 of the trim plate 506. With the back housing 508 installed within the trim plate 506, additional mounting fasteners 716 can be used to secure the back housing 508 to the trim plate 506. In some examples, the through holes 546 of the trim plate 506 are threaded so that fasteners 716 can be used to anchor the back housing 508 within the trim plate 506, as shown in FIGS. 28-30. Each fastener 716 passes the back housing 508 and the trim plate 506 to complete the installation process of the wall mounting assembly 504. The wiring 702 can then be connected to the thermostat 502, which is then placed into electrical communication with a power source and/or HVAC equipment to be controlled. The thermostat 502 is at least partially received within the recessed section 540 of the trim plate 506, and engages the back housing 508, as shown in FIGS. 32-34. A lock screw 718 can then be passed upwardly through the hole 580 within the mounting tab 578 of the back housing 508 and threaded into the mounting hole 526 of the thermostat 502 to secure the thermostat 502 into place within the thermostat assembly 500, as depicted in FIG. 34.

Figure 36:
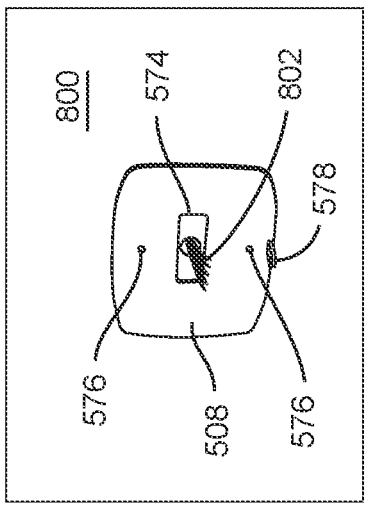
Figure 37:
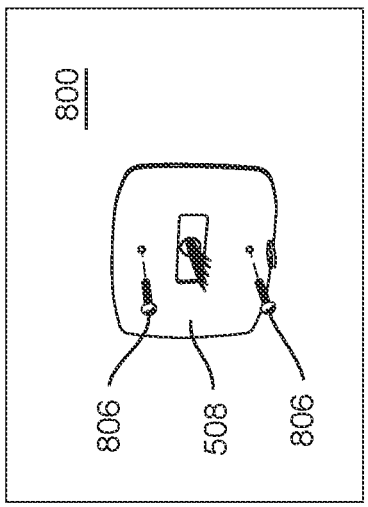
Figure 38:
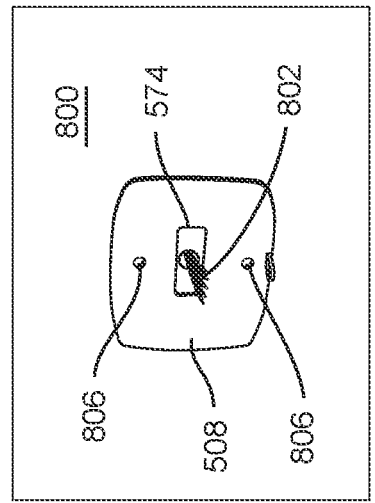
Figure 39:
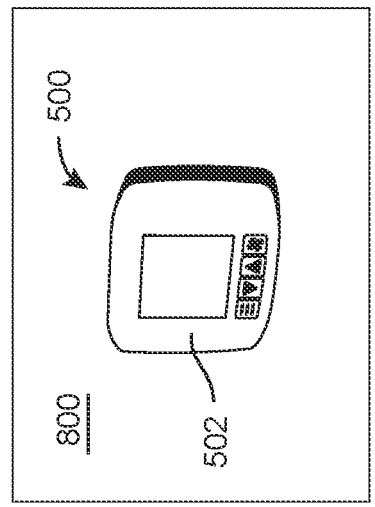
Figure 40:
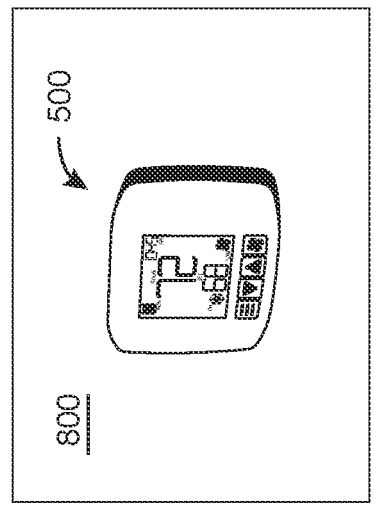

The thermostat assembly 500 can also be installed onto a standard wall 800, as depicted in FIGS. 35-40. Initially, wiring 802 can extend outwardly from a hole 804 formed through the wall 800. With no junction box to couple the thermostat assembly 500 to, the trim plate 506 can be omitted, and the back housing 508 can be mounted directly to the wall 800. The wiring 802 can be passed through the passageway 574, and the back housing 508 can be secured to the wall 800, as depicted in FIGS. 36-38. Fasteners 806 can be urged into the through holes 576 and threaded directly into the wall 800. The wiring 802 can then be connected to the thermostat 502, which is then placed into electrical communication with a power source and/or HVAC equipment to be controlled. The thermostat 502 engages the back housing 508, as shown in FIGS. 39-40. A lock screw (not shown) can then be passed upwardly through the hole 580 within the mounting tab 578 of the back housing 508 and threaded into the mounting hole 526 of the thermostat 502 to secure the thermostat 502 into place within the thermostat assembly 500 to complete the installation process.

Using the systems and methods disclosed herein, a thermostat assembly 500 can be readily installed into a variety of different structures without modification. The location and type of positioning and mounting features streamlines installation, particularly as it relates to vertical junction boxes.

Figure 41:
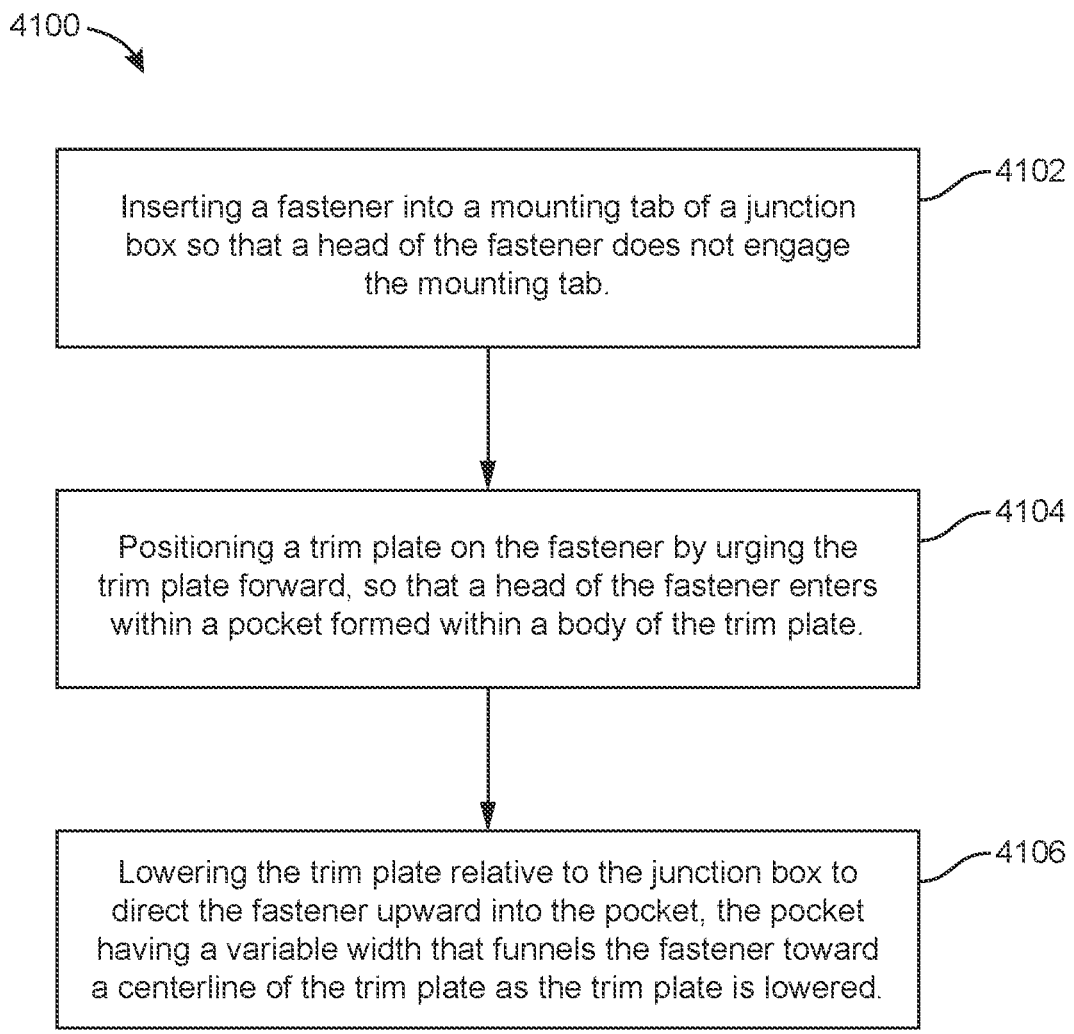
FIG. 41 is a flow diagram of a process for installing a thermostat.

Referring now to FIG. 41, a process 4100 for mounting and positioning functionality that facilitates installation of a thermostat is shown, according to some embodiments. Process 4100 is shown to include inserting a fastener into a mounting tab of a junction box so that a head of the fastener does not engage the mounting tab (step 4102). Process 4100 is shown to include positioning a trim plate on the fastener by urging the trim plate forward, so that a head of the fastener enters within a pocket formed within a body of the trim plate (step 4104). Process 4100 is shown to include lowering the trim plate relative to the junction box to direct the fastener upward into the pocket, the pocket having a variable width that funnels the fastener toward a centerline of the trim plate as the trim plate is lowered (step 4106).

Configuration of Exemplary Embodiments

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It is important to note that the construction and arrangement of various systems (e.g., system 100, system 200, etc.) and methods as shown in the various exemplary embodiments is illustrative only. Additionally, any element disclosed in one embodiment may be incorporated or utilized with any other embodiment disclosed herein. Although only one example of an element from one embodiment that can be incorporated or utilized in another embodiment has been described above, it should be appreciated that other elements of the various embodiments may be incorporated or utilized with any of the other embodiments disclosed herein.

What is claimed is:

1. A trim plate for a wall mounting assembly, comprising:
a body defined by a first end and a second end opposite the first end, the first end defining a front section and the second end defining a rear section, the body defining a passageway extending from the rear section, through the body, to the front section, the body further comprising:
a plurality of mounting holes formed through the body and spaced apart from one another around the passageway; and
a positioning feature formed outward from the passageway and spaced apart from the mounting holes, the positioning feature defined by rearwardly extending walls partially surrounding an aperture formed through the front section of the body, the rearwardly extending walls defining a pocket formed therebetween, the pocket extending along the rear section beyond the aperture;
wherein the pocket is further defined by a cover extending at least partially across the pocket from each of the rearwardly extending walls, the cover defining tapered surfaces formed inwardly from the rearwardly extending walls and a terminal portion defined by a width smaller than a width of the aperture.

2. The trim plate of claim 1, wherein the aperture is positioned along a centerline of the passageway.

3. The trim plate of claim 1, wherein the pocket is further defined by a rounded stop extending between ends of the rearwardly extending walls.

4. The trim plate of claim 1, wherein the pocket is defined by a continuous structure extending from a first side of the aperture, upwardly toward an outer perimeter of the body, to a rounded stop, and downwardly toward a second side of the aperture opposite the first side.

5. The trim plate of claim 1, wherein the plurality of mounting holes include at least two different sizes of holes.

6. The trim plate of claim 1, wherein the body is defined by a raised perimeter section surrounding a recessed section, and wherein the plurality of mounting holes and the passageway are each formed through the recessed section.

7. A wall mounting assembly for a thermostat, the wall mounting assembly comprising:
a trim plate having a body defined by a first end and a second end opposite the first end, the first end defining a front section and the second end defining a rear section, the body defining a first passageway extending from the rear section, through the body, to the front section, the body further comprising:
a plurality of mounting holes formed through the body and spaced apart from one another around the first passageway; and
a positioning feature formed outward from the first passageway and spaced apart from the mounting holes, the positioning feature defined by rearwardly extending walls partially surrounding an aperture formed through the front section of the body, the rearwardly extending walls defining a pocket formed therebetween, the pocket extending along the rear section beyond the aperture; and
a back housing received within the body of the trim plate, the back housing defining a second passageway therethrough aligned along a centerline of the first passageway, the second passageway being smaller than the first passageway;
wherein the pocket is further defined by a cover extending at least partially across the pocket from each of the rearwardly extending walls, the cover defining tapered surfaces formed inwardly from the rearwardly extending walls and a terminal portion defined by a width smaller than a width of the aperture.

8. The wall mounting assembly of claim 7, wherein the back housing is defined by a body having a rectangular shape and further including a mounting tab extending outwardly away from the body, the mounting tab including a hole formed therethrough.

9. The wall mounting assembly of claim 7, wherein at least two holes formed through the back housing are aligned coaxially with at least two mounting holes within the plurality of mounting holes.

10. The wall mounting assembly of claim 7, wherein the aperture is positioned along the centerline of the first passageway.

11. The wall mounting assembly of claim 7, wherein the pocket is further defined by a rounded stop extending between ends of the rearwardly extending walls.

12. The wall mounting assembly of claim 7, wherein the pocket is defined by a continuous structure extending from a first side of the aperture, upwardly toward an outer perimeter of the body, to a rounded stop, and downwardly toward a second side of the aperture opposite the first side.

13. The wall mounting assembly of claim 7, wherein the plurality of mounting holes include at least two different sizes of holes.

14. The wall mounting assembly of claim 7, wherein the body is defined by a raised perimeter section surrounding a recessed section, and wherein the plurality of mounting holes and the first passageway are each formed through the recessed section, and wherein the back housing is received within the recessed section.

* * * * *